INVENTORS
JACOB E. THOMAS JR.
DONALD R. YOUNG

BY Everett A. Gastrell
ATTORNEY

United States Patent Office 3,333,326

Patented Aug. 1, 1967

3,333,326

METHOD OF MODIFYING ELECTRICAL CHARACTERISTIC OF SEMICONDUCTOR MEMBER

Jacob E. Thomas, Jr., New York, and Donald R. Young, Poughkeepsie, N.Y., assignors to International Business Machines Corporation, New York, N.Y., a corporation of New York Filed June 29, 1964, Ser. No. 378,850
8 Claims. (Cl. 29—574)

The present invention is directed to methods of modifying an electrical characteristic of a semiconductor member. More particularly, the invention relates to methods of modifying the resistance of a semiconductor member. While the invention has a variety of applications, it has particular utility for adjusting to a predetermined value the resistance of a semiconductor member forming part of a monolithic solid circuit. Accordingly, the invention will be described in that environment.

Present indications are that monolithic integrated circuits will come into common use. Instead of employing thin-film resistors on the surface of the semiconductor body as in prior integrated circuit applications, it is expected that the semiconductor body of a monolithic solid circuit will embody resistors which are created by diffusing a significant impurity of one conductivity type into a semiconductor region of the opposite type and attaching suitable terminals to the extremities of that region. Although such a diffused resistor can be made to close dimensions, it is very difficult to fabricate it to a desired resistance value within close tolerances. The dimensions of a film resistor can be reduced as by abrading to increase the resistance thereof and thereby adjust or tailor the latter to a desired value. However, such a technique is impractical in the tailoring of a diffused resistor in a monolithic integrated circuit since that resistor is covered by a passivating protective layer.

It is an object of the invention, therefore, to provide a new and improved method of modifying an electrical characteristic of a semiconductor member.

It is another object of the invention to provide a new and improved method of tailoring the resistance of a semiconductor resistor employed in a monolithic integrated circuit.

It is a further object of the invention to provide a new and improved method of simultaneously modifying the resistance of a plurality of diffused resistors of a monolithic integrated circuit.

It is a still further object of the invention to provide a new and improved method of modifying the resistance of a resistor of a monolithic solid circuit without an abrading or material-removing operation.

In accordance with the particular form of the invention, the method of modifying an electrical characteristic of a semiconductor member having a layer of insulating material contiguous with the surface portion of that member comprises passing a predetermined first value of current from a constant-voltage source through the member at a temperature in the operating temperature range of the member. The method also includes heating the member and the layer to a temperature significantly higher than the aforesaid range which changes the value of that current, and producing in that layer at the higher temperature an electric field of an intensity which modifies at least one of the hole and electron density in a surface portion of the member adjacent the interface of the member and the layer and further changes the value of the aforesaid current to a predetermined second value. The method additionally includes cooling the member to a temperature in the aforesaid range which establishes therein in the member a desired value of current that is different from the aforesaid predetermined first value and is representative of the desired electrical characteristic of the member in the aforesaid range.

The foregoing and other objects, features and advantages of the invention will be apparent from the following more particular description of preferred embodiments of the invention, as illustrated in the accompanying drawings.

DESCRIPTION OF MONOLITHIC CIRCUIT OF FIG. 1A

Figure 1A:
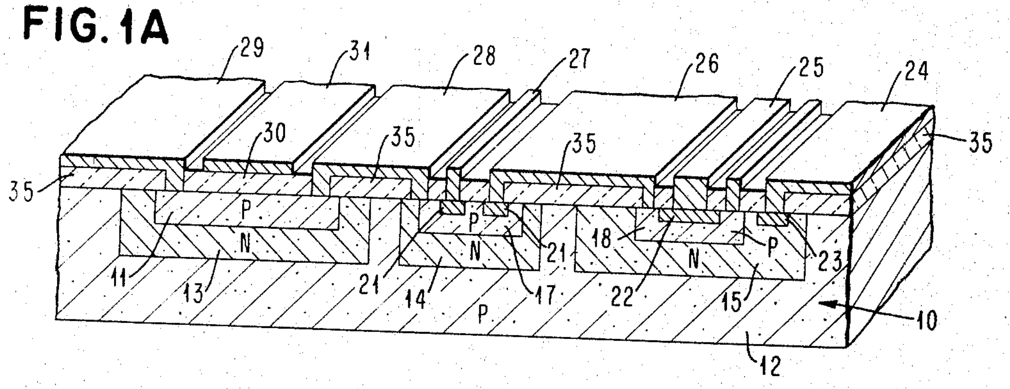
FIG. 1A is a cross-sectional view of portion of a monolithic integrated circuit which includes a semiconductor resistor.
Figure 1B:
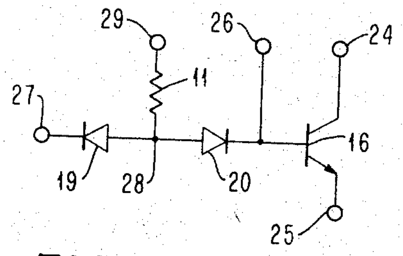
FIG. 1B is a circuit diagram of the monolithic circuit of FIG. 1A.

Referring now to FIG. 1A of the drawings, there is represented a portion of a typical monolithic integrated circuit 10 which includes a semiconductor member or resistor 11, an electrical characteristic of which may be modified by the method of the present invention. Circuit 10 includes a suitable semi-conductor substrate 12, such as one of P-type silicon. Diffused into portions of the substrate by well-known techniques are several N-type members 13, 14 and 15. Members 13 and 14 are employed for isolation purposes while member 15 constitutes the collector region of an NPN transistor 16 shown schematically in FIG. 1D. Diffused into portions of the members 13, 14 and 15 are P-type members 11, 17 and 18. Member 11 is the semi-conductor resistor, as previously mentioned, member 18 constitutes the base region of the transistor 16, and member 17 is a portion that is common to the semiconductor diodes 19 and 20 (see also FIG. 1B) to be described more fully hereinafter. Diffused in a conventional manner into the P-type members 17 and 18 are heavily doped N+ type members 21, 21 and 22. Members 21, 21 constitute the remaining regions of the semiconductor diodes 19 and 20 while member 22 is the emitter of the transistor 16. An N+ type member 23 in the collector member or region 15 facilitates making an ohmic connection thereby via electrode 24. A conventional passivating layer 35 of a suitable insulating material such as silicon dioxide is intimately attached to the upper surface of the monolithic circuit and covers various of the PN junctions where they extend to the surface as represented. Openings appear in the silicon dioxide layer to permit electrodes 25, 26, 27, 28 and 29 to be ohmically attached in a known manner as by evaporation to the various exposed semiconductor regions. Several of these electrodes extend over portions of the layer 35 as represented to make the various connections indicated in the circuit diagram of FIG. 1B. These electrodes are represented in FIG. 1A and are identified by the same reference numerals appearing in the FIG. 1B circuit diagram.

DESCRIPTION OF SEMICONDUCTOR RESISTOR OF FIGS. 1A AND 1C

Figure 1C:
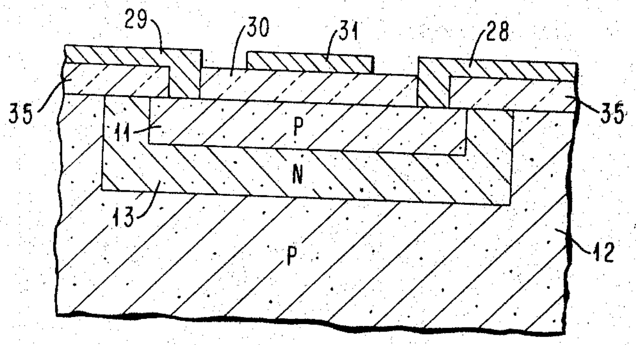
FIG. 1C is an enlarged sectional view of the semiconductor resistor of FIG. 1A.

Attention is now directed to the semiconductor member 11 which constitutes the resistor under consideration and has an electrical characteristic or resistance that is to be modified in accordance with the method of the prevent invention. Contiguous with the upper surface of the member 11 and lying between the electrodes 28 and 29 that are ohmically secured to the extremities of member 11 is a layer of 30 of insulating material such as silicon dioxide or glass. See also FIG. 1C. When glass is employed as that insulating layer, it is preferably one of the type that is stable at a temperature of about 150° C. and can be heated to a somewhat higher temperature such as about 200–300° C. Various glasses may be employed such as lead-alumino-borosilicate glass and zinc-alumino-borosilicate glass. A representative glass of the first type which can be heated to about 250° C. is one having a composition in weight percentage of the following oxides: 56.8 lead oxide, 3.9 aluminum oxide, 10.7 boron trioxide and 28.6 silicon dioxide. A zinc-alumino-borosilicate glass which can be heated to about 300° C. contains 4.5% aluminum oxide, 26.5% boron trioxide, 10.1% silicon dioxide and 58.9% zinc oxide. Layer 30 may have a thickness of about ½ micron when it consists of silicon dioxide and a thickness of about 2 microns when it is made of glass.

When silicon dioxide constitutes the insulating layer 30, it may be formed in the well-known manner by the thermal oxidation of silicon in an atmosphere which is rich in oxygen such as in an environment of steam or water vapor. Alternatively, the silicon dioxide layer may be formed by the known thermal decomposition of a siloxane compound such as tetraethyoxysilane. When glass is employed as the insulating layer 30, it is preferably applied by the sedimentation and fusing techniques disclosed and claimed in the copending application of William A. Pliskin and Ernest E. Conrad, now U.S. Patent 3,212,921; Ser. No. 141,668, filed Sept. 29, 1961, entitled, "Method of Forming Glass Film on Object and Product Produced Thereby," and assigned to the same assignee as the present invention. A glass layer possesses some advantages over silicon dioxide in that the former permits tailoring of the resistance of the diffused resistor 11 so as selectively to increase or decrease the conductance thereof whereas the adjustment can be in but one direction when a silicon dioxide layer involved. An area-type metal electrode 31 is disposed on most of the upper surface of the layer 30 for purposes to be explained subsequently.

METHOD OF MODIFICATION OF RESISTANCE OF SEMICONDUCTOR RESISTOR

Figure 2:
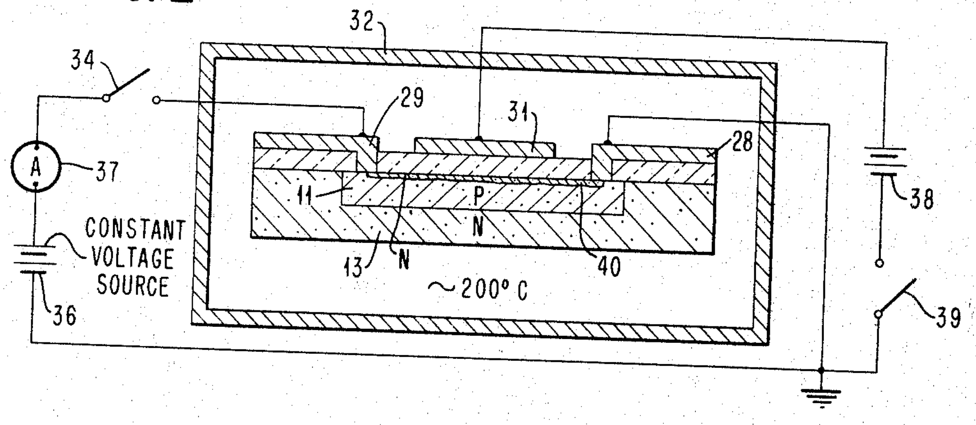
FIG. 2 is a diagrammatic representation of apparatus for practicing the method of the present invention.

The resistance of the semiconductor resistor 11 may be modified with an arrangement such as that represented in FIG. 2. The monolithic solid circuit is placed in an oven 32 which can be heated to an elevated temperature such as one in the range from about 200–300° C. For simplicity of representation, only the resistor 11, its electrodes 28 and 29, and its underlying supporting N-type member 13 have been illustrated in FIG. 2. The selected temperature range should be such that it does not deleteriously influence other components of the monolithic solid circuit. A series combination of a switch 34, a constant-voltage source 36 capable of delivering a predetermined known voltage, and a suitable current meter 37 are connected between the resistor electrodes 28 and 29, the former being grounded. A bias voltage source 38 under the control of a switch 39 is connected between the electrode 31 on the top of the insulating layer 30 and the electrode 28 for producing at the upper surface of semiconductor member or resistor 11 an electric field of an intensity which modifies at least one of the hole and electron density in a surface portion of member 11 adjacent the interface of the member and the insulating layer. Source 38 is one which is capable of developing a voltage such as 10–30 volts. For some applications, depending on device geometry and materials, a potential of a few volts may be satisfactory.

Before considering the operation of the apparatus of FIG. 2, it will be assumed that the semiconductor material of member 11, the concentration of the significant impurities therein and the depth of diffusion together with the geometry thereof have been selected so that there results a semiconductor resistor having a resistance which is close to a desired value but requires a modification to bring it within prescribed tolerance limits. This ordinarily results from the normal fabrication of such a resistor. Since a constant-voltage source 36 is employed in the circuit of the resistor 11, any change in the current flowing therein is representative of the change in the resistance thereof, the current being inversely proportional to the resistance. Accordingly, the current meter 37 can be calibrated to indicate resistance. It will now be assumed that the switch 34 is closed and the switch 39 is open.

Figure 3:
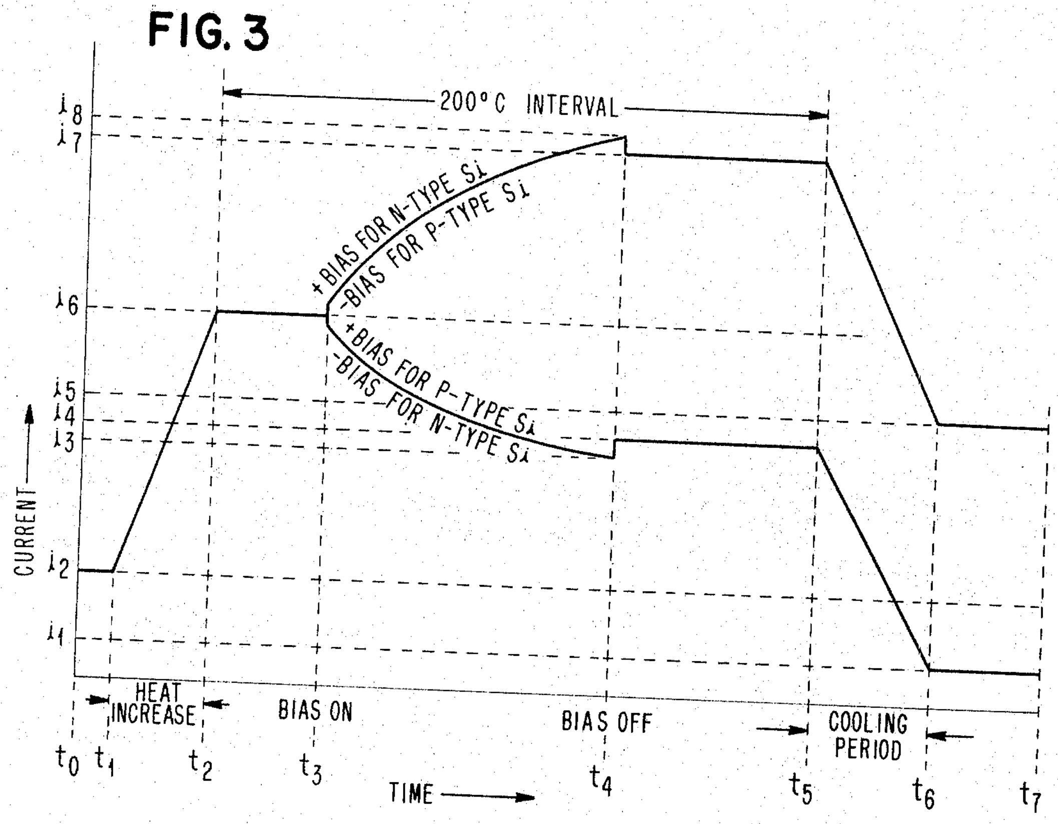
FIG. 3 is a graph employed in explaining the operation of a particular form of the method of the present invention.

Referring now to FIG. 3 of the drawings, it will be assumed that at time $t_0$–$t_1$ the monolithic circuit including the resistor 11 is at the operating temperature of the resistor and that a first predetermined value of current $i_2$ is flowing through the resistor as the result of the constant voltage applied thereto by the source 36. Additional heat developed in the oven 32 at time $t_1$ causes the current typically to rise as indicated during the interval $t_1$–$t_2$ to the value $i_6$ wherein it remains fairly constant over the period $t_2$–$t_3$. During the last-mentioned interval and the subsequent interval $t_3$–$t_5$, the semiconductor resistor is held in the oven 32 at a suitable temperature such as about 200° C. which is significantly higher than the operating temperature of the resistor and the monolithic circuit. At time $t_3$ switch 39 is closed to apply a positive bias to the electrode 31 on the insulating layer 30 over the P-type resistor 11. This bias produces in the insulating layer 30 an electric field of an intensity which modifies at least one and usually both the hole and electron density in a surface portion of the semiconductor member 11 adjacent the interface of that member and the insulating layer. Furthermore that field changes the value of the current to a predetermined second value to be mentioned subsequently. The manner in which this is accomplished is complex and is not fully understood. It is believed that the indicated positive bias may invert the surface portion of the P-type member at the interface of the silicon dioxide (or glass) layer 30 and create a thin N-type film or skin 40 as represented in FIG. 2. This in turn diminishes the effective thickness of the P-type member 11 and increases its resistance. This action is represented graphically in FIG. 3 by the decrease in current during the interval $t_3$–$t_4$ when the current decreases from the value $i_6$ to the value $i_3$. Since the source 36 develops a constant voltage, a decrease in current is representative of an increase in the resistance of the resistor 11. Under the described condition of elevated temperature and bias, there results a shift in the characteristic of the insulating layer 30 which causes a gradual decrease in the current flow through the resistor 11 until such time as the bias voltage supplied by the source 38 is removed. This modification in the characteristic of the insulating layer is in effect fixed in that layer and is retained therein after the resistor has been cooled to its normal operating temperature, which cooling will be described later. It is believed that this modification of the characteristic of the insulating layer is caused by ionic migration occurring in the presence of the electric field, resulting in the formation of a space charge layer at the interface of the semiconductor resistor 11 and the insulating layer 30. Glass and silicon dioxide are insulating materials in which the above-described effect occurs.

If desired, the bias applied by the source 38 may be removed at time $t_4$, in which case the current may tend to increase slightly to the value $i_4$ during the interval $t_4$–$t_5$ when the resistor is still at the elevated temperature of about 200° C. It is presently considered to be preferable to maintain the bias voltage on the resistor during the interval $t_4$–$t_5$ and also during the succeeding period $t_5$–$t_6$. During the interval $t_5$–$t_6$, the oven 32 is permitted to cool to a temperature in the operating temperature range of the resistor 11 of the monolithic integrated circuit 10.

The current through the resistor decreases during that interval to a desired value of current $i_1$ which is different from the first predetermined value $i_2$ and thereafter remains at the desired value so long as the resistor is maintained at its operating temperature, such as during a period $t_6$–$t_7$.

From the foregoing explanation, it will be seen that the temperature-bias treatment is effective to modify the value of the current through the resistor from a predetermined first value $i_2$ to a second or desired value $i_1$. Since that desired value is also representative of the desired resistance of the resistor, the temperature-bias technique explained above is useful in tailoring the resistance of a diffused semiconductor resistor without performing any mechanical expedients such as abrading that resistor. It will be evident that to procure the desired value of the resistance for resistors having different dimensions, materials and impurity concentrations, that the various parameters such as currents, heating and biasing intervals, the magnitude of the bias and the temperatures together with the extent of the cooling period must be determined experimentally to establish the proper relationships. Once established, the tailoring of the resistance of the member 11 can readily be determined by the method explained above. Subsequent to the tailoring operation explained above, the monolithic integrated circuit and its associated diffused resistor should not be raised greatly above their operating temperature so as to maintain the desired resistance for the resistor 11.

While the method of the present invention has been explained in connection with a P-type semiconductor resistor 11, it may also be employed in connection with an N-type semiconductor resistor by applying a negative bias to the area-type electrode 31 having a layer of glass thereunder. The resistance tailoring is in the direction to increase the resistance of the member 11 in the manner described above. However, the negative bias-temperature treatment is ineffective for an N-type member 11 when a silicon dioxide layer is disposed beneath the electrode 31.

The resistance of the semiconductor resistor may be tailored in the opposite sense by a temperature-bias treatment to decrease the resistance to a predetermined value. When the semiconductor resistor 11 is of a P-type material and the insulating layer 30 is made of glass, a negative bias is applied to the electrode 31 to produce the electric field in the resistor and the desired reduction in resistance. For example, if the temperature of the resistor is about 200° C. and the bias condition is as just mentioned at time $t_3$, the current to the resistor increases from the value $i_6$ to the value $i_8$ at time $t_4$, decreases slightly to the value $i_7$ when the bias is removed from electrode 29, remains at substantially that level during the interval $t_4$–$t_5$, decreases sharply during the cooling period $t_5$–$t_6$ when the oven temperature is reduced to the device operating temperature at time $t_6$, and remains at the level $i_5$ thereafter so long as the device remains at its operating temperature. It will be clear that the desired current level $i_5$ is representative of the desired resistance of the P-type resistor 11 as the result of the temperature-bias treatment.

The temperature-negative bias treatment just described is ineffective when the insulating layer 30 is silicon dioxide and the resistance material is P-type semiconductor. However, when the resistance material is N-type and either glass or silicon dioxide forms insulating layer 30, the application of a positive bias to the electrode 31 and the described heat treatment will produce resistance tailoring corresponding to that described in the preceding paragraph.

Although the operation of the FIG. 2 arrangement has been explained in connection with the passage of a steady current through the resistor 11 from the constant voltage source 36, the passage of current may be a recurrent one such as would occur if the switch 34 were recurrently opened and closed by conventional means and the indication of the meter 37 observed during the intervals when the switch was closed. While the operation has been explained in connection with the use of a substantially constant elevated temperature which is above the normal device operating temperature, during the intervals when the switch 34 is closed a somewhat lower temperature may be employed. It will be evident also from the foregoing explanation that the resistance of several semiconductor resistors may be tailored individually and simultaneously in the manner explained above in connection with the resistor 11.

FIG. 4 TYPE OF OPERATION

The arrangement of FIG. 2 is capable of another type of operation which has utility for some applications. For example, it may be desirable to utilize the resistor 11 in a circuit such that it has a first value of resistance for a predetermined period of time. Thereafter it may be desirable to alter that resistance to a second predetermined value for operation thereat for a second interval of time. The temperature bias method of the present invention permits the resistance to be adjusted electrically and thermally.

Figure 4:
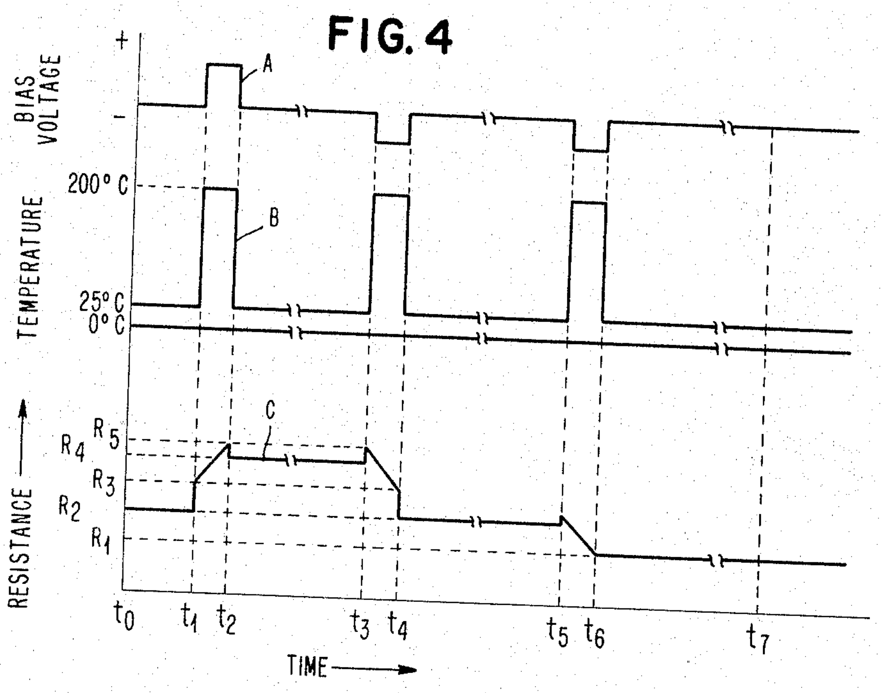
FIG. 4 is another graph used to explain another procedure in accordance with the invention.

FIG. 4 is a family of curves which are useful in explaining the manner in which the resistance of the resistor is selectively modified. For this explanation it will be assumed that member 11 is P-type silicon and the insulating layer 30 is glass. Curve A represents the bias voltage which is applied to the electrode 31 of FIG. 2; Curve B represents the temperature of the resistor; and Curve C represents the change in resistance experienced by the member 11. During the interval $t_0$–$t_1$ the member 11 is operated at its normal operating temperature which will be assumed to be about 25° C. and has a resistance of $R_2$. For periods such as time $t_2$–$t_3$ it is desired to impart to the member or resistor 11 a greater resistance value $R_4$. This may be accomplished by applying to the electrode 31 a bias voltage represented by Curve A during the interval $t_1$–$t_2$ while simultaneously applying to the arrangement a temperature of about 200° C. represented by Curve B during that same interval. This causes the resistance of member 11 to increase momentarily as represented by Curve B at time $t_1$ to the value $R_3$, whereupon it climbs to the value $R_5$ and then decreases slightly at time $t_2$ to the steady value $R_4$. At time $t_2$, the bias voltage and the temperature decrease to their original values as represented by Curves A and B and the resistance remains at the value $R_4$ for a prolonged interval $t_2$–$t_3$.

It will now be assumed that it is desired to decrease the resistance of the resistor 11 to its original value $R_2$. This may be accomplished by the simultaneous application of a negative bias voltage as represented by Curve A during the interval $t_3$–$t_4$ and the temperature change represented by Curve B for the same period. This causes the resistance to increase momentarily to the high value $R_5$ and then to decrease during the period $t_3$–$t_4$ to the value $R_3$ at time $t_4$, whereupon it decreases suddenly to the value $R_2$. The temperature-bias treatment represented by Curves A and B ends at time $t_4$ and the resistance of the semiconductor resistor remains at the initial value $R_1$ for a desired period of time $t_4$–$t_5$.

Assuming now that one desires to decrease the resistance to the value $R_1$ which is lower than the starting value $R_2$, the procedure indicated by Curves A and B during the interval $t_5$–$t_6$ is repeated, whereupon the resistance is modified to the new low value $R_1$ at time $t_6$ where it remains for the period $t_6$–$t_7$ providing no further temperature-bias treatment follows.

While the invention has been particularly shown and described with reference to preferred embodiments thereof, it will be understood by those skilled in the art that various changes in form and details may be made therein without departing from the spirit and scope of the invention.

What is claimed is:

1. The method of modifying the resistance of a semiconductor member of P or N type having a layer of insulting material contiguous with a surface portion of said member comprising:

establishing a norm by passing a predetermined first value of current from a constant-voltage source through said member at a temperature in the operating temperature range of said member;

heating said member and said layer from an external source of heat to a temperature significantly higher than said range and which changes the value of said current;

producing in said layer at said higher temperature an electric field of an intensity which modifies at least one of the hole and electron density in a surface portion of said member adjacent the interface of said member and said layer to such degree as to further change the value of said current to a predetermined second value; and cooling said member to a temperature in said operating range which establishes thereat in said member a desired value of current that is different from said predetermined first value and is representative of the desired electrical resistance of said member in said range.

2. The method of modifying the resistance of a semiconductor member of P or N type having an insulating layer selected from the group consisting of silicon oxide and glass contiguous with a surface portion of said member comprising:

establishing a norm by passing a predetermined first value of current from a constant-voltage source through said member at a temperature of about 25° C. in the operating temperature range of said member;

heating said member and said layer from an external source of heat during said passing of current to a temperature in the range of 200–300° C. which is significantly higher than said operating range and which changes the value of said current;

producing in said layer at said higher temperature during said passing of current an electric field of an intensity which modifies at least one of the hole and electron density in a surface portion of said member adjacent the interface of said member and said layer to such degree as to further change the value of said current to a predetermined second value; and cooling said member during said passing of current while under the influence of said electric field to a temperature in said operating range which establishes thereat in said member a desired value of current that is different from said predetermined first value and is representative of the desired electrical resistance of said member in said operating range.

3. The method of modifying the resistance of a semiconductor member of P or N type having a layer of insulating material contiguous with a surface portion of said member comprising:

applying an area-type electrode to said layer;

establishing a norm by passing a predetermined first value of current from a constant-voltage source through said member at a temperature in the operating temperature range of said member;

heating said member and said layer from an external source of heat to a temperature significantly higher than said range and which changes the value of said current;

biasing said electrode to produce in said layer at said higher temperature an electric field of an intensity which modifies at least one of the hole and electron density in a surface portion of said member adjacent the interface of said member and said layer to such degree as to further change the value of said current; and cooling said member to a temperature in said operating range which establishes thereat in said member a desired value of current that is different from said predetermined first value and is representative of the desired electrical resistance of said member in said range.

4. The method of modifying the resistance of a semiconductor member of P or N type having an insulating layer contiguous with a surface portion of said member comprising:

applying an area-type electrode to said layer;

establishing a norm by passing a predetermined first value of current from a constant-voltage source through said member at a temperature in the operating temperature range of said member;

heating said member and said layer from an external source of heat to a temperature significantly higher than said operating range and which changes the value of said current;

biasing said electrode relative to said member with a voltage in the range of 10–30 volts to produce in said layer at said higher temperature an electric field of an intensity which modifies at least one of the hole and electron density in a surface portion of said member adjacent the interface of said member and said layer to such degree as to further change the value of said current; and cooling said member while under the influence of said electric field to a temperature in said operating range which establishes thereat in said member a desired value of current that is different from said predetermined first value and is representative of the desired electrical resistance of said member in said operating range.

5. The method of modifying the resistance of a semiconductor member of P or N type comprising:

covering a surface portion of said member with an insulating layer of silicon dioxide;

applying an area-type electrode to said layer;

establishing a norm by passing a predetermined first value of current from a constant-voltage source through said member at a temperature in the operating temperature range of said member;

heating said member and said layer from an external source of heat to a temperature of about 200° C. which is significantly higher than said range and which changes the value of said current;

biasing said electrode to produce in said layer at said higher temperature an electric field of an intensity which modifies at least one of the hole and electron density in a surface portion of said member adjacent the interface of said member and said layer to such degree as to further change the value of said current; and cooling said member to a temperature in said operating range which establishes thereat in said member a desired value of current that is different from said predetermined first value and is representative of the desired electrical resistance of said member in said range.

6. The method of modifying the resistance of a semiconductor member of P or N type comprising:

covering a surface portion of said member with an insulating layer of a zinc-alumino-borosilicate glass;

applying an area-type electrode to said layer;

establishing a norm by passing a predetermined first value of current from a constant-voltage source through said member at a temperature in the operating temperature range of said member;

heating said member and said layer from an external source of heat to a temperature of about 300° C. which is significantly higher than said range and which changes the value of said current;

biasing said electrode to produce in said layer at said higher temperature an electric field of an intensity which modifies at least one of the hole and electron density in a surface portion of said member adjacent the interface of said member and said layer to such degree as to further change the value of said current; and cooling said member to a temperature in said operating range which establishes thereat in said member a desired value of current that is different from said predetermined first value and is representative of the desired electrical resistance of said member in said range.

7. The method of modifying the resistance of a semiconductor member of P or N type comprising:

covering a surface portion of said member with an insulating layer of a lead-alumino-borosilicate glass;

applying an area-type electrode to said layer;

establishing a norm by passing a predetermined first value of current from a constant-voltage source through said member at a temperature in the operating temperature range of said member;

heating said member and said layer from an external source of heat to a temperature of about 250° C. which is significantly higher than said range and which changes the value of said current;

biasing said electrode to produce in said layer at said higher temperature an electric field of an intensity which modifies at least one of the hole and electron density in a surface portion of said member adjacent the interface of said member and said layer to such degree as to further change the value of said current; and cooling said member to a temperature in said operating range which establishes thereat in said member a desired value of current that is different from said predetermined first value and is representative of the desired electrical resistance of said member in said range.

8. The method of modifying the resistance of a semiconductor member of P or N type comprising:

covering a surface portion of said member with an insulating layer having a thickness in the range of about 0.5–2 microns;

applying an area-type electrode to said layer;

establishing a norm by passing a predetermined first value of current from a constant-voltage source through said member at a temperature in the operating temperature range of said member;

heating said member and said layer from an external source of heat to a temperature in the range of 200–300° C. which is significantly higher than said operating range and which changes the value of said current;

biasing said electrode relative to said member with a voltage in the range of 10–30 volts to produce in said layer at said higher temperature an electric field of an intensity which modifies at least one of the hole and electron density in a surface portion of said member adjacent the interface of said member and said layer to such degree as to further change the value of said current; and cooling said member while under the influence of said electric field to a temperature in said operating range which establishes thereat in said member a desired value of current that is different from said predetermined first value and is representative of the desired electrical resistance of said member in said operating range.

References Cited

UNITED STATES PATENTS

| | | | |
|---|---|---|---|
| 2,639,246 | 5/1953 | Dunlap | 148—1.5 X |
| 2,725,317 | 11/1955 | Kleimack | 148—11.5 |
| 2,744,970 | 5/1956 | Shockley. | |
| 2,900,531 | 8/1959 | Wallmark | 317—235 X |
| 3,148,129 | 9/1964 | Basseches | 29—155.62 X |
| 3,246,173 | 4/1966 | Silver | 307—88.5 |

WILLIAM I. BROOKS, *Primary Examiner.*

JOHN F. CAMPBELL, *Assistant Examiner.*